United States Patent
Sedaghat et al.

(10) Patent No.: US 11,550,547 B2
(45) Date of Patent: Jan. 10, 2023

(54) RANDOM NOISE GENERATION

(71) Applicant: Cisco Technology, Inc., San Jose, CA (US)

(72) Inventors: Mohammad Ali Sedaghat, Erlangen (DE); Christopher R. Fludger, Nuremberg (DE); Andreas Bisplinghoff, Forchheim (DE); Gregory Bryant, Raleigh, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 381 days.

(21) Appl. No.: 16/732,603

(22) Filed: Jan. 2, 2020

(65) Prior Publication Data

US 2020/0218511 A1    Jul. 9, 2020

(30) Foreign Application Priority Data

Jan. 3, 2019   (GB) ..................... 1900078

(51) Int. Cl.
  *G06F 7/58*     (2006.01)
  *G01R 31/3177*  (2006.01)
  *H03K 3/84*     (2006.01)

(52) U.S. Cl.
  CPC ........... *G06F 7/58* (2013.01); *G01R 31/3177* (2013.01); *H03K 3/84* (2013.01)

(58) Field of Classification Search
  CPC .......... G06F 7/58; H03K 3/84; G01R 31/3177
  See application file for complete search history.

(56) References Cited

U.S. PATENT DOCUMENTS 7,334,009 B2 * 2/2008 Henry ................. G06F 9/30003
                                                          708/250
8,296,345 B2 * 10/2012 Crispin .................... G06F 7/58
                                                          708/250

(Continued)

FOREIGN PATENT DOCUMENTS

JP        H0580987 A      4/1993

OTHER PUBLICATIONS

Examination Report in counterpart United Kingdom Application No. GB1900078.5, dated Jul. 24, 2019, 4 pages.

*Primary Examiner* — April Y Blair
*Assistant Examiner* — Matthew W Wahlin
(74) *Attorney, Agent, or Firm* — Edell, Shapiro & Finnan, LLC

(57) ABSTRACT

A random noise generator for generating a plurality of random noise samples per clock cycle, the noise samples having a distribution. The random noise generator comprises at least a first comparator unit and a second comparator unit, the first comparator unit configured to generate a first plurality of samples representing a high-probability part of the distribution and the second comparator unit configured to generate a second plurality of samples representing a low-probability part of the distribution; and a random selection unit connected to at least the first comparator unit and the second comparator unit. The random selection unit is configured to receive the first plurality of samples generated by the first comparator unit and the second plurality of samples generated by the second comparator unit, to output a random selection of samples from the first plurality of samples and the second plurality of samples.

20 Claims, 11 Drawing Sheets

(56) References Cited

U.S. PATENT DOCUMENTS

| | | | |
|---|---|---|---|
| 8,332,449 B2* | 12/2012 | Chen | G06F 1/02 |
| | | | 708/250 |
| 9,973,287 B2* | 5/2018 | Ogasawara | H04B 15/06 |
| 2017/0364477 A1* | 12/2017 | Thach | G06N 7/046 |

* cited by examiner

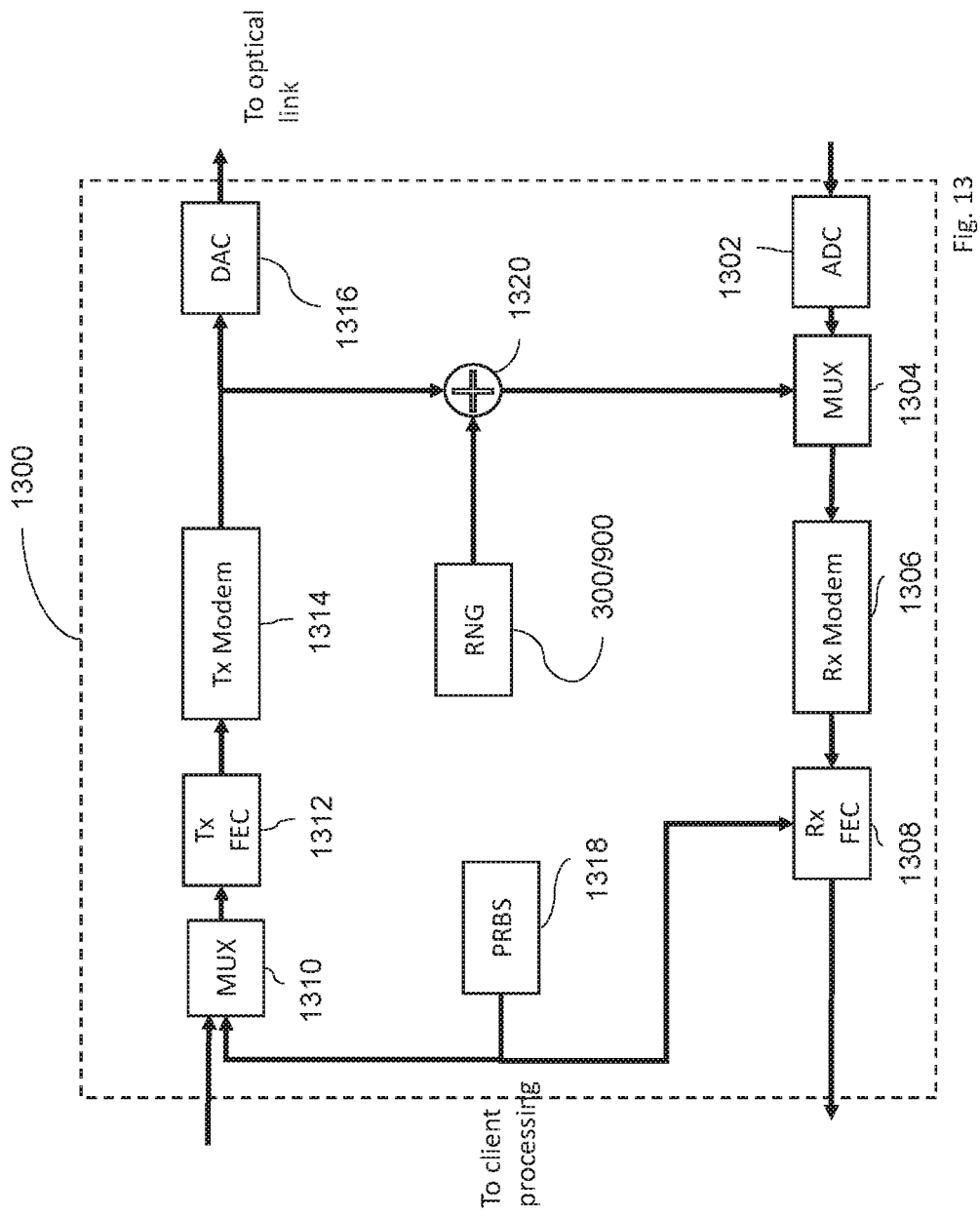

US 11,550,547 B2

RANDOM NOISE GENERATION

PRIORITY CLAIM

This application claims priority to United Kingdom Patent Application No. 1900078.5, filed Jan. 3, 2019, the entirety of which is incorporated herein by reference.

TECHNICAL FIELD

The present disclosure relates generally to a Random Noise Generator (RNG).

BACKGROUND

Random Noise Generators (RNGs) generate noise samples. The random noise generated may need to meet a desired noise distribution (e.g., a desired Probability Density Function (PDF)).

In one particular application, a RNG can be used to supply random noise samples to test and debug the functionality of high speed communications Application Specific Integrated Circuits (ASICs).

BRIEF DESCRIPTION OF THE DRAWINGS

Examples of the present disclosure will now be explained with reference to the accompanying drawings in which:

FIG. 13 is a block diagram of an Application Specific Integrated Circuits (ASIC) testing circuit according to an example embodiment.

Throughout the description and the drawings, like reference numerals refer to like parts.

DESCRIPTION OF EXAMPLE EMBODIMENTS

Overview

Figure 1:
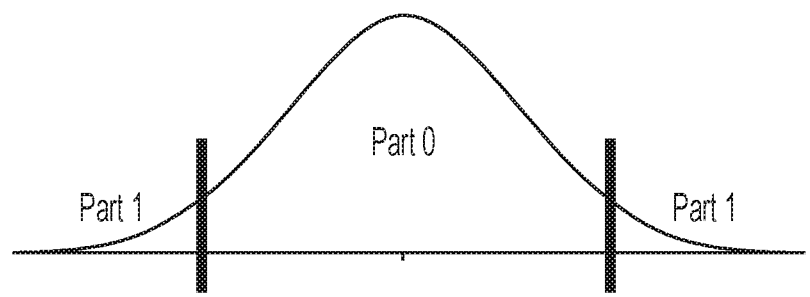
FIG. 1 shows an example of a symmetric distribution of noise.

Briefly, a Random Noise Generator (RNG) and a random noise generation method are presented for generating a plurality of random noise samples per clock cycle, the noise samples having a distribution. The RNG generally comprises at least a first comparator unit (first comparator) and a second comparator unit (second comparator). The first comparator unit is configured to generate a first plurality of samples representing a high-probability part of the distribution and the second comparator unit is configured to generate a second plurality of samples representing a low-probability part of the distribution. A random selection unit may be connected to at least the first comparator unit and the second comparator unit. The random selection unit is configured to receive the first plurality of samples generated by the first comparator unit and the second plurality of samples generated by the second comparator unit, and to output a random selection of samples from the first plurality of samples and the second plurality of samples.

A random noise generation method is also provided for generating a plurality of random noise samples per clock cycle, the noise samples having a distribution. The method may comprise generating a first plurality of samples representing a high-probability part of the distribution, generating a second plurality of samples representing a low-probability part of the distribution and outputting a random selection of samples from the first plurality of samples and the second plurality of samples.

Also described is a method of designing a RNG for generating a plurality of random noise samples per clock cycle, the noise samples having a distribution, and a method for generating a plurality of random noise samples per clock cycle. The method may comprise dividing the distribution of the noise samples into at least a first, high-probability part of the distribution and a second, low-probability part of the distribution. Based on a required number of samples per clock cycles, the method may comprise determining the number of samples per clock cycle used from the first, high-probability part of the distribution and the second, low-probability part of the distribution, the number of samples per clock cycle used from the first, high-probability part of the distribution being higher/greater than the number of samples from the second, low-probability part of the distribution. A first plurality of samples may then be generated representing the high-probability part of the distribution according to the number of the number of samples per clock cycle used from the first, high-probability part of the distribution. A second plurality of samples may be generated representing the low-probability part of the distribution according to the number of the number of samples per clock cycle used from the second, low-probability part of the distribution. A random selection of samples from the first plurality of samples and the second plurality of samples is then output to provide random noise.

Example Embodiments

In high speed communications, e.g. optical communications, with a low Bit-Error-Rate (BER) regime, the parts of a noise distribution with low probabilities (the so-called "tails" of the distribution or Probability Density Function (PDF)) may be utilized, and these rare events make noise generation quite complicated. Using previous approaches to generate noise leads to complexity (e.g., large Application Specific Integrated Circuit (ASIC) area and power consumption) because of the long tails in the PDF with very low probability.

According to embodiments presented herein, noise samples with an arbitrary distribution are generated. Digital noise sample generation is typically based on Quasi-Random Number Generators (QRNGs), such as Mersenne Twister, Exclusive Or (XOR)-shift, etc. These QRNGs provide a bit-stream with very good statistical properties. If groups of bits of this bit-stream are interpreted as integer numbers, e.g. 32 bit-integer, those numbers are uniformly distributed. These uniformly distributed integer numbers are then transferred into samples of a desired arbitrary distribution.

For some particular distributions, arithmetic methods may be applied to transfer uniformly distributed integer numbers into samples of a desired arbitrary distribution, e.g. Box-Muller for a Gaussian distribution. However, this involves complex computations such as sine, cosine, logarithm, which are not very suitable for ASIC implementation.

One approach to convert uniformly distributed samples into an arbitrary distribution is an Inverse Cumulative Distribution Function (ICDF) method.

In ICDF, the uniformly distributed samples are grouped into sets of samples whose relative quantity correspond to the desired distribution. For example: groups of 8 bits are taken from the QRNG, which correspond to 256 different uniformly distributed integer numbers. The distribution may be divided into intervals. For instance, if the integer number falls into the interval [0;2] the ICDF generates a "1"; if the integer number is in the interval [3;256] the ICDF generates a "2". The resulting distribution consists of two different samples 1 and 2 with the probabilities p1=3/256 and p2=253/256.

The number of QRNG-bits which are considered in the ICDF determine the granularity of probabilities of the final distribution. For example: if groups of 8 bits are taken from the QRNG the granularity of probabilities is 1/64=0.00390625. Approximately 50 QRNG-bits are considered if a granularity of $10^{-15}$ is desired.

The fixed-point resolution of the final distribution determines into how many groups the QRNG samples are split, and thus against how many thresholds the QRNG number is to be compared. For example, if the final noise sample has 6-bit resolution, the QRNG number is compared against 63 thresholds.

If noise samples with very fine amplitude resolution (number of thresholds) and very fine probability resolution (number of QRNG-bits) are to be generated at very high frequency (as is typical for optical communications), the ICDF complexity is likely to be too great for ASIC implementation.

The proposed RNG is configured to carry out parallel processing such that, at each clock cycle of a processor, N noise samples are generated (Bus width=N), where N is a positive integer. The proposed RNG is suitable to produce noise samples for any probability distribution. The benefit is particularly significant when the distribution can be split into some parts with different orders of probability (for example, splitting a Gaussian distribution into a central part with high probability and tail parts with low probability).

In a first embodiment, a case is considered in which noise samples are generated for a probability distribution considered as two parts. This is appropriate for symmetric PDFs around one point (e.g., the mean) with tails, such as a Gaussian PDF. FIG. 1 shows an example of a Gaussian PDF split into two parts, Part 0 (a central part of high-probability) and Part 1 (tail part with low-probability). The distribution shown in FIG. 1 is symmetrical about 0. Statistically, a standard deviation 6 for the PDF shown can be calculated. It is noted that fixed-point realization in an ASIC involves transformation of a continuous Gaussian PDF into a discrete probability distribution, which approximates the Gaussian PDF.

Figure 2:
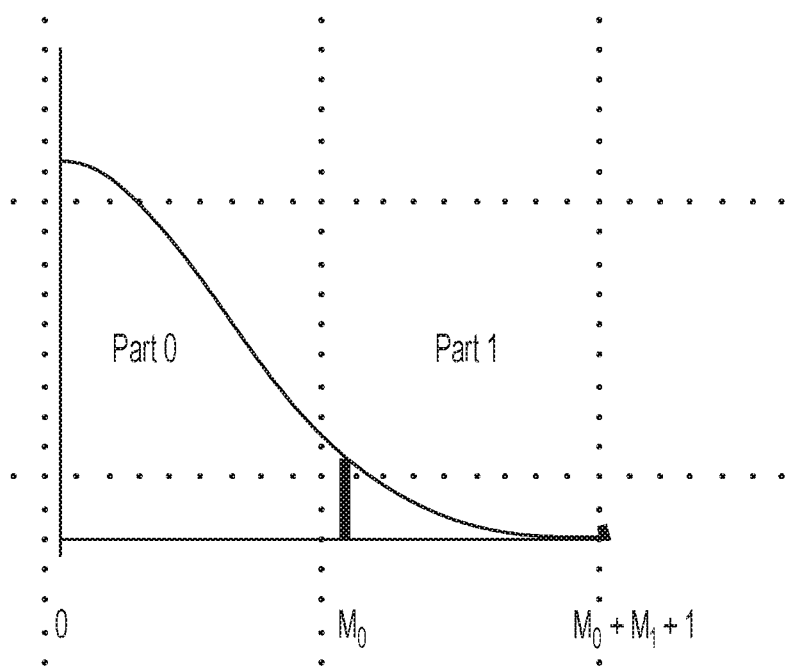
FIG. 2 is one half of the distribution shown in FIG. 1.

FIG. 2 shows one half of the distribution shown in FIG. 1. The division between Part 0 (a part of the distribution with high-probability) and Part 1 (a part of the distribution with low-probability) is indicated as $M_0$. The end of the tail is indicated as $M_0+M_1+1$.

According to the techniques presented herein, samples from different parts are generated separately and then randomly spread over the bus. In this case, it is not necessary to generate N samples from the low-probability tail part (Part 1) but fewer samples may be generated as there is a lower probability of these samples occurring. This is quite useful because generating noise samples for a low probability part of the PDF (e.g., the tail) would otherwise dominate the overall complexity.

According to a first embodiment of the RNG, the following assumptions are made:
  N noise samples are to be generated in parallel per clock cycle, N being a positive integer;
  $\log_2 N$ is an integer;
  the PDF is a symmetric PDF around 0 (e.g. Gaussian PDF);
  N samples are generated from the central part (Part 0) since there is high chance that all the samples on the bus are from the central part (Part 0);
  $N_1$ samples are generated from the low probability part (part 1) (the tail part), where $N_1$ is a positive integer and $N_1 \ll N$; and
  $L_0$ and $L_1$ are the bit precisions (number of bits) for inputs to the central part (Part 0) and the tail part (Part 1), respectively.

Figure 3:
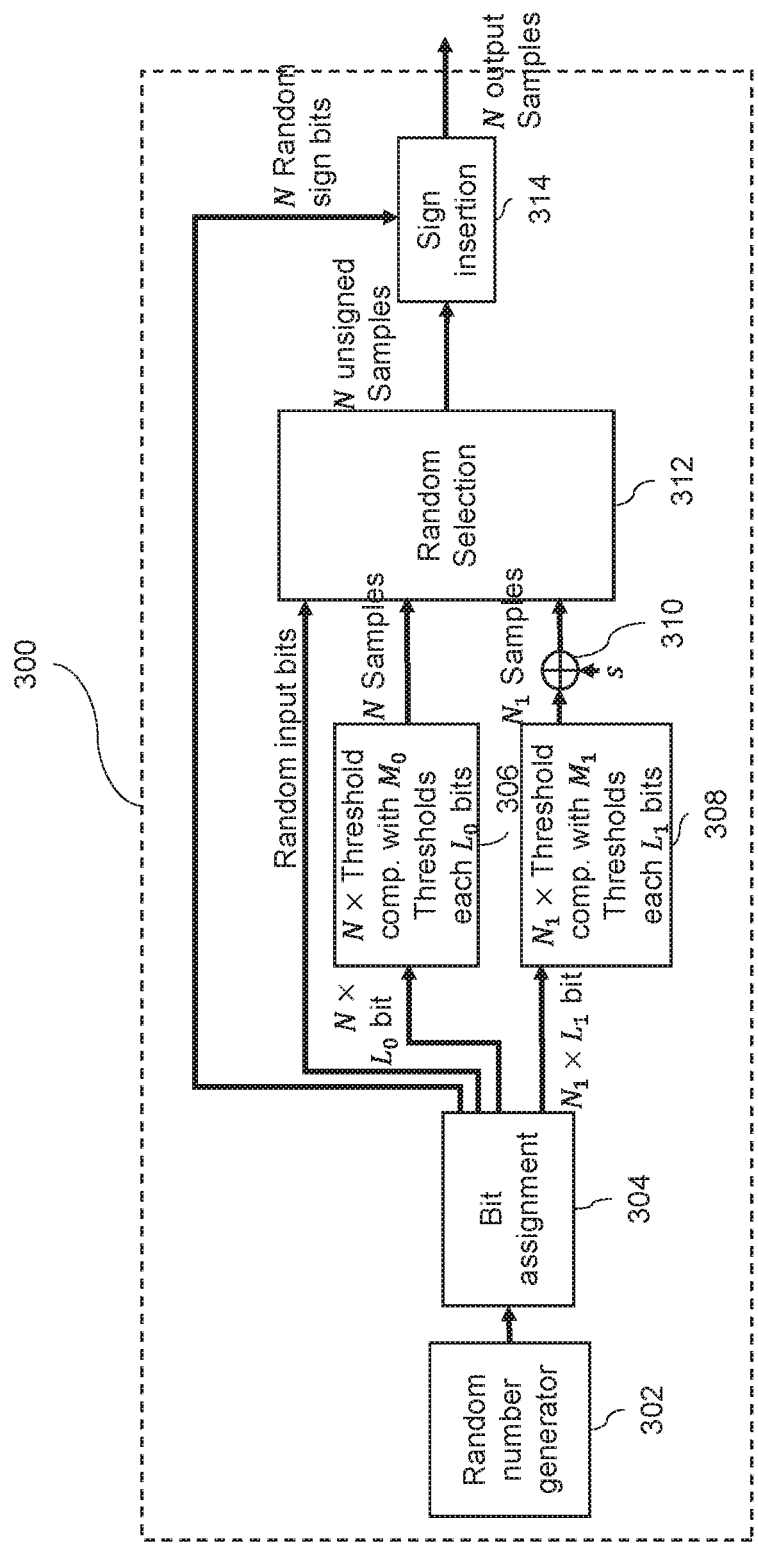
FIG. 3 is a block diagram of an embodiment of a system for implementing the random noise generation methods described herein.

FIG. 3 shows a first example of a RNG 300 for generating noise samples for a symmetric probability distribution considered as two parts, for instance as shown in FIGS. 1 and 2.

The RNG 300 comprises a random number generator 302, a bit assignment unit 304, a first comparator unit 306, a second comparator unit 308, a shift unit 310, a random selection unit 312 and a sign insertion unit 314.

The random number generator 302 generates random numbers as the inputs to the bit assignment unit 304. The random number generator 302 may be any random number generator with an ability to generate several samples in parallel. For instance, the random number generator 302 may be a Mersenne Twister (MT), such as one that is able to generate up to 624 words (each 32 bit) at each clock.

The bit assignment unit 304 distributes the random numbers (or bits) output from the random number generator 302 to the other units of the RNG 300. For instance, the bit assignment unit 304 outputs the random numbers (or bits) output from the random number generator 302 to the first comparator unit 306, the second comparator unit 308, the random selection unit 312, and the sign insertion unit 314, as will be described below.

Figure 4:
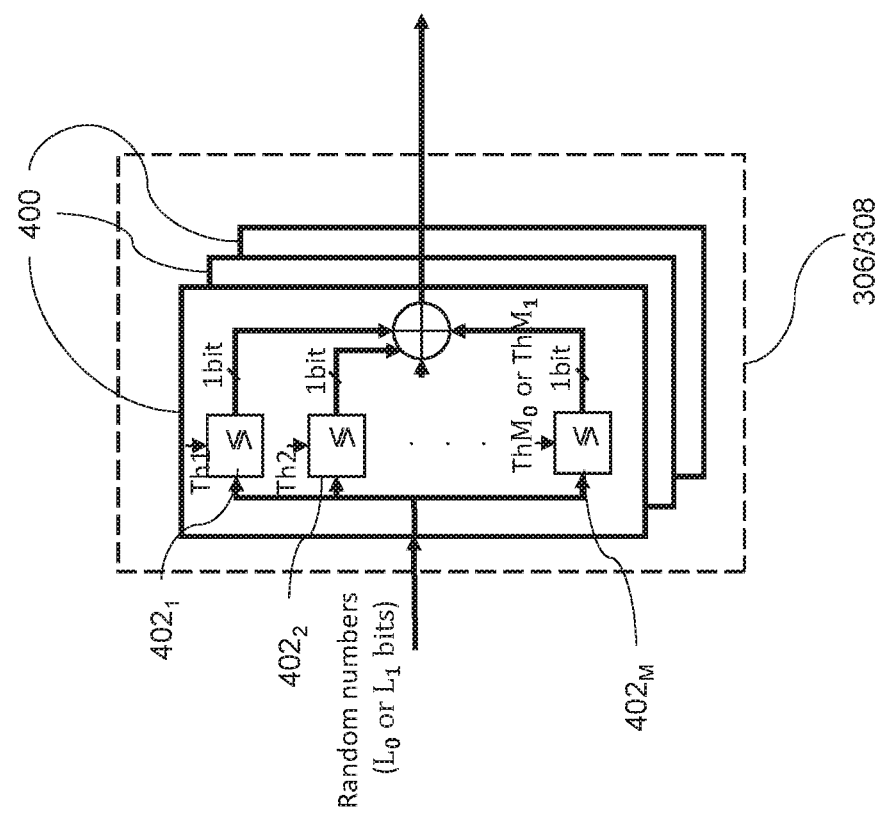
FIG. 4 is a block diagram of an embodiment of a comparator unit forming a part of the system shown in FIG. 3.

With reference to FIG. 4, the first and second comparator units 306 and 308 are described in more detail. Each of the first and second comparator units 306 and 308 comprise a plurality of threshold comparator units 400. Each threshold comparator unit 400 has a plurality of threshold comparators $402_1, 402_2, \ldots, 402_M$, where M is a positive integer. First comparator unit 306 has a first plurality N of threshold comparator units 400, each having $M_0$ threshold comparators $402_1, 402_2, \ldots, 402_{M0}$, where $M_0$ is a positive integer. Second comparator unit 308 has a second plurality $N_1$ of threshold comparators units 400, each having $M_1$ threshold comparators $402_1, 402_2, \ldots, 402_{M1}$, where $M_1$ is a positive integer.

Each of the M threshold comparators $402_1, 402_2, \ldots, 402_M$ has a threshold $Th_1, Th_2 \ldots, Th_M$. Each of the threshold comparator units 400 of the first and second comparator units 306 and 308 receives random numbers from the bit assignment unit 304 (FIG. 3).

In one embodiment, the first comparator unit 306 generates N noise samples relating to the first, high-probability part of the distribution (Part 0). In such an embodiment, the number of threshold comparator units 400 in the first comparator unit 306 is N (the number of samples per clock cycle). This is because there is a high probability that the samples will be from the central, high probability part of the distribution. N random numbers assigned by the bit assignment unit 304 are input to the first comparator unit 306, each random number being of length $L_0$. The calculation of $L_0$ will be described below. The first comparator unit 306 outputs, at each clock cycle, N noise samples of $M_0$ bits.

The second comparator unit 308 generates noise samples relating to the second, low-probability part of the distribution (Part 1). In one embodiment, the number of threshold comparator units 400 in the second comparator unit 308 is $N_1$ where $N_1 \ll N$. This is because there is a low probability that the samples will be from the tail, low-probability part of the distribution. $N_1$ random numbers assigned by the bit assignment unit 304 are input to the second comparator unit 308, each random number being of length $L_1$, where $L_1 \gg L_0$. The reason $L_1 \gg L_0$ is that the tail parts comprise very low probabilities with very fine granularity and hence use more bits. The calculation of $L_1$ will be described below. The second comparator unit 308 outputs, at each clock cycle, $N_1$ noise samples of $M_1$ bits.

Each of the M threshold comparators $402_1, 402_2, \ldots, 402_M$ compares the received random number with a corresponding one of the thresholds $Th_1, Th_2 \ldots, Th_M$ and outputs a bit on the basis of the comparison. For instance, a threshold comparator $402_1, 402_2, \ldots, 402_M$ outputs 1 when the received random number is greater than the threshold and a 0 when the received random number is equal to or less than the threshold. This threshold relationship may be defined differently. For example, an output of 1 is produced when the received random number is equal to or greater than the threshold and a 0 is output when the received random number is lower than the threshold. The M output bits of the threshold comparators $402_1, 402_2, \ldots, 402_M$ are summed up to generate an output sample with [1d(M+1)] bits resolution. The number M of comparators 402 determines the number of bits output from each of the first and second comparator units 306 and 308.

The first comparator unit 306 generates N noise samples relating to the first, high-probability part of the distribution (Part 0). The first comparator unit 306 outputs, at each clock cycle, N noise samples of $M_0$ bits. The second comparator unit 308 generates $N_1$ noise samples relating to the second, low-probability part of the distribution (Part 1). The second comparator unit 308 outputs, at each clock cycle, $N_1$ noise samples of $M_1$ bits.

Turning back to FIG. 3, the shift unit 310 offsets the magnitude of the samples from the second comparator unit 308 (the samples representing the low-probability, tail part) by s. The samples from the second comparator unit 308 are to be offset by s since the output of the threshold comparators in the second comparator unit 308 is in the range $[0, M_1]$ rather than $[M_0+1, M_0+M_1+1]$ (as shown in FIG. 2). In this example therefore, the samples from the second comparator unit 308 are offset by $s=M_0+1$. The tail samples representing the low-probability, tail part are obtained after this offsetting. The offset value s is not constant and is preferably tuneable since it changes for different PDFs (as well as different variances).

The random selection unit 312 receives the outputs from the first comparator unit 306 and the shifted outputs from the second comparator unit 308 and spreads the samples from the low-probability part (the tail part) randomly among the samples from the first, high-probability part. The random selection unit 312 achieves this by firstly calculating how many samples from the $N_1$ tail samples are to be used and then determining the positions of those samples on the bus. The random selection unit 312 then outputs N noise samples selected from the outputs from the first and second comparator units 306 and 308.

The manner by which the random selection unit 312 calculates how many samples from the $N_1$ tail samples are to be used and then determines the positions of those samples on the bus may be implemented in various ways.

Figure 5:
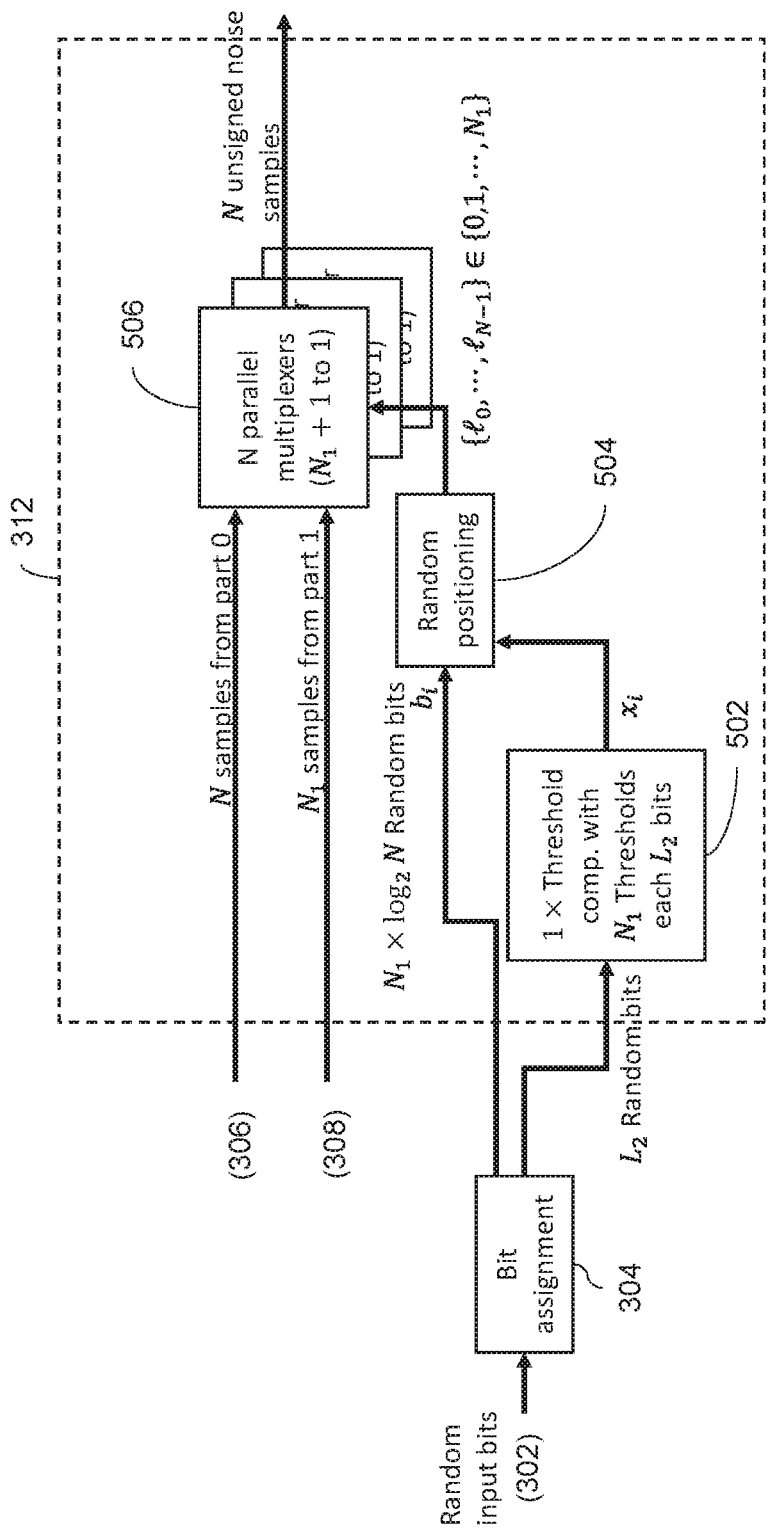
FIG. 5 is a block diagram of a random selection unit forming part of the system shown in FIG. 3, according to a first example embodiment.

Reference is now made to FIG. 5, which shows one example of a random selection unit 312. In the embodiment of the random selection unit 312 shown in FIG. 5, the random selection unit 312 comprises a threshold comparator block 502, a random positioning block 504 and N parallel multiplexers (MUXs) 506.

The threshold comparator block 502 first determines how many samples $x_1$ are to be selected from the low-probability, tail part (part 1). The threshold comparator block 502 is of a design similar to that shown in FIG. 4, with the threshold comparator block 502 having $N_1$ threshold comparators $402_1, 402_2, \ldots, 402_{N1}$. The threshold comparator block 502 receives a random number $L_2$ from the bit assignment unit 304. This random number is then compared with the $N_1$ thresholds of the threshold comparator block 502. These thresholds mimic a binomial distribution with $p=\Sigma p2$, which is the cumulative probability of the tail part. The threshold comparator block 502 outputs a number $x_1$ indicating the number of samples to be used from the second comparator unit 308 (the comparator unit outputting samples representative of the low-probability (tail part)).

The random positioning block 504 receives the output $x_1$ of the threshold comparator block 502 and a random number output from the bit assignment unit 304. The positioning is done based on the input of random bits received from the bit assignment unit 304. The random positioning block 504 generates random positions for the required tail samples (for the $i^{th}$ sample, the output of random positioning block 504 is zero when the sample is to be from the high probability part (part 0) and is a random position in $\{1, \ldots, N\}$ when the sample is to be from the tail part). $t_i$ refers to the sample which is to be used in $i^{th}$ position. If $t_i=0$, the sample from the part 0 is used, otherwise $t_i^{th}$ sample from the part 1 is selected.

Inputs: $\{b_1, b_2, \ldots, b_{24}\}$ each $\log_2 N$ bits, $x_1$
Output: $\{t_1, \ldots, t_{1024}\}$ each $\log_2 N_1$ bits and set initially to zero
for (n=1:$x_1$)
    $t_{b_n}$=n
end The MUXs 506 comprise MUXs that multiplex ($N_1+1$) inputs to 1 output. In total, therefore, N parallel MUXs 506 output N samples. For each output sample (N in total), there is one MUX which decides from which part the sample is taken. Therefore, there are N parallel MUXs 506. The random positioning block 504 generates N outputs l_i to control the N MUXs. If l_i=0, the MUX takes the i-th sample from the high probability part 0. If l_i n>0 the MUX takes the l_i-th sample from the tail part 1.

Figure 6:
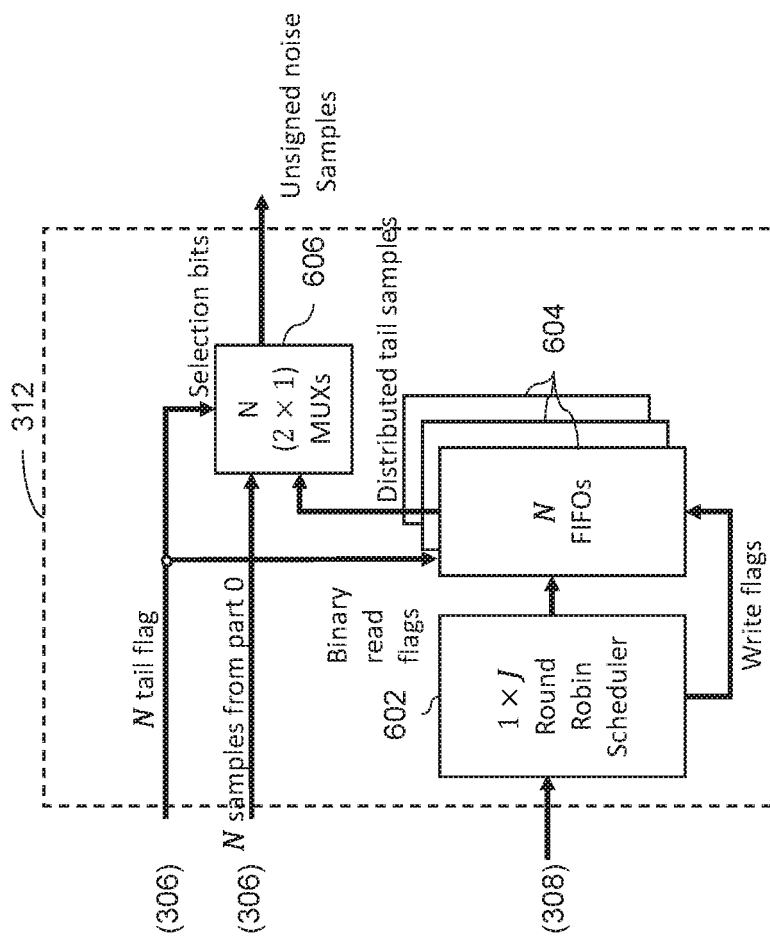
FIG. 6 is a block diagram of a random selection unit forming part of the system shown in FIG. 3, according to a first second embodiment.

Reference is now made to FIG. 6. FIG. 6 shows another implementation for the random selection unit 312 used to select from the $N_1$ tail samples output from the second comparator unit 308. In the embodiment of the random selection unit 312 shown in FIG. 6, the random selection unit 312 comprises a round robin scheduler 602, N First-In First-Out (FIFO) memory blocks 604 and N parallel MUXs 606.

In this embodiment, the first comparator unit 306 (FIG. 3) has an additional threshold comparator (not shown) to determine, for each of the N bus positions, whether a sample is to be selected from the tail. This is called a tail flag. (This differs from the implementation shown in FIG. 5 which has an extra threshold comparator (threshold comparator block 502) to decide how many samples in each clock cycle are to be from the tail part).

The tail samples generated by the second comparator unit 308 are inserted into the N FIFO memory blocks 604 using the round robin scheduler 602. The samples are grouped into J groups, and every N/J clock a new sample is inserted to the FIFO of a sample. For every sample, N parallel MUXs 606 (e.g., a 2×1 MUX) is used to select between the sample from first comparator unit 306 (representing a sample from part 0) and the samples in the FIFOs (representing a sample from part 1). J, $N_1$ and the length of the N FIFO memory blocks 604 are large enough such that the chance of lack of samples in the N FIFO memory blocks 604 becomes negligible.

Referring back to FIG. 3, the N noise samples output by the random selection unit 312 are input to the sign insertion unit 314. The sign insertion unit 314 is applicable when the distribution (PDF) of the noise samples is assumed to have symmetry around 0 (or around a known value). To reduce complexity, when the distribution is symmetric, the RNG applies the presented method to the positive part of the PDF and then, using the symmetry of the PDF, a random sign bit is applied to each sample. N random bits from the bit assignment unit 304 are input to the sign insertion unit 314 and define the sign bits of the samples. The sign insertion unit 314 randomly applies signs to the N noise samples output by the random selection unit 312 in accordance with the N random bits from the bit assignment unit 304 so as to distribute the samples over the entire distribution (as shown, for example, in FIG. 1).

A working example is now be described, for an example of a Gaussian noise distribution in which $M_0=\lfloor 3\sigma\ max\rfloor$, $M_0+M_1+1=\lfloor 8\sigma\ max\rfloor$, N=1024, ($\sigma_{max}$ is the maximum supported standard deviation of the distribution).

Let P(0) and P(1) be the probability of the high-probability part of the distribution (Part 0) and the low-probability part of the distribution (Part 1), respectively, and (P(0)+P(1)=1). The probability of having more than no samples from the low-probability (tail) part (Part 1) at one clock is:

$$\sum_{i=n0+1}^{N} \binom{N}{i} P(1)^i (1-P(1))^{N-i}$$

Figure 7:
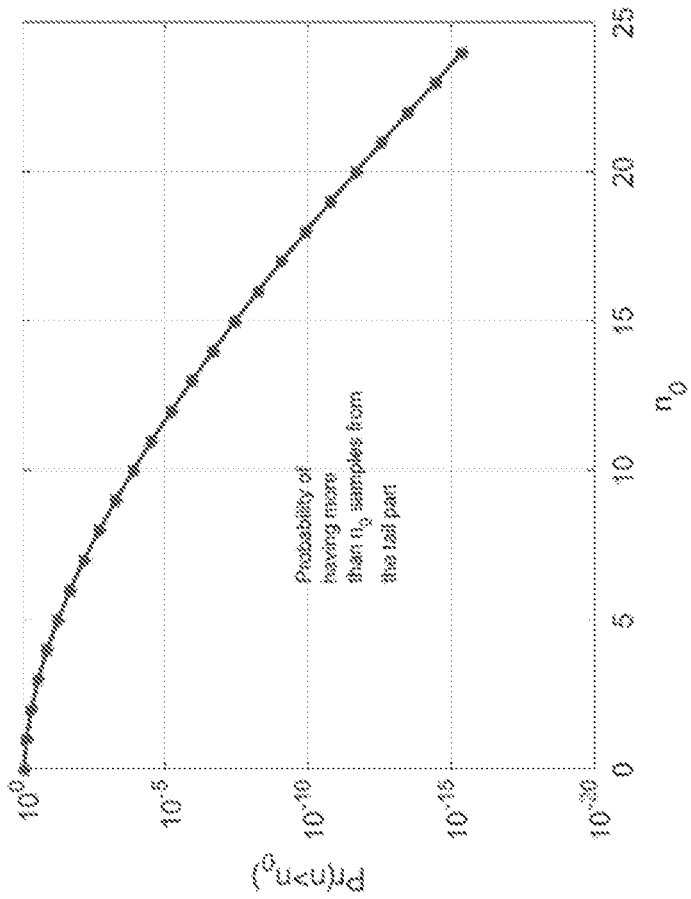
FIG. 7 is a plot that shows an example of the probability of having more than no samples from a low probability part of the random noise distribution.

This is illustrated in FIG. 7. As can be seen from FIG. 7, for a BER target of approximately $10^{-15}$, generating $\sim n_0=N_1=24$ samples for the low-probability part of the distribution does not significantly affect the output noise samples' PDF. This results in a factor of 1024/25≈41 improvement in complexity compared with generating 1024 samples for the low-probability part of the distribution.

The samples in the high-probability part of the distribution (Part 0–[0,$M_0$]) are generated by the first comparator unit 306 and the samples in the low-probability part of the distribution (part 1–[$M_0$+1: $M_0+M_1$+1]) are generated by the second comparator unit 308.

For an example to generate Gaussian noise with a tail to 8σ, N=1024 and σ∈[0,10], σ being the standard deviation:

1. Choose $M_0$ such that P(1)<<1. Choosing $M_0=\lfloor 3\sigma_{max}\rfloor$ will meet this criterion so, for this example, $M_0=\lfloor 3\sigma_{max}\rfloor$=30. Then P(1)=2Q(3)≈0.0027 (where Q(x) is the $$Q\text{-function} = \int_{\chi}^{+\infty} \frac{1}{\sqrt{2\pi}} \exp(-t^2/2) dt$$

However, other values may be chosen for $M_0$, such that P(1)<<1, for example $M_0$ equal to 2.5σ, 3.5σ, 4σ4.5σ, 5σ, 6σ, etc.

2. Since $M_0+M_1+1=\lfloor 8\sigma\rfloor$, and $M_0$=30, then $M_1$=49.
3. Part 0: To measure the lowest probability in the part 0

$$=> P_{min} = \frac{\left(Q\left(\frac{29.5}{10}\right) - Q\left(\frac{30.5}{10}\right)\right)}{1-Q(3.05)} \approx 4.45e-04$$

=>Let $L_0$=15 to fulfill $(2^{L_0}-1)P_{min}$>>1, $L_0$ being the number of bits for the random numbers to be assigned by the bit assignment unit 304 to the first comparator unit 306.

4. To be able to measure the probability up to 8σ in the low-probability part (part 1)

$$=> P_{min} = \frac{\left(Q\left(\frac{78.5}{10}\right) - Q\left(\frac{79.5}{10}\right)\right)}{Q(3.05)} \approx 1e-12$$

=>Let $L_1$=48 to fulfill $(2^{L_1}-1)P_{min}$, >>1, $L_1$ being the number of bits for the random numbers to be assigned by the bit assignment unit 304 to each of the $N_1$ threshold comparator units 400 in the second comparator unit 308.

5. $N_1$=24 to have negligible probability of lack of samples in the part 1, as discussed above.

6. Let the shift factor s=$\lfloor 3\sigma\rfloor$. Note that the thresholds of the comparators 402 in the first comparator unit 306 (for samples in the part 0 of the distribution) outside of the range [0,3σ] are set to all 1. The same applies to the thresholds of the comparators 402 in the second comparator unit 308 (for samples in the part 1 of the distribution) which are outside of the range 8σ.

7. To be able to measure the probability of having 24 tail samples $$=> P_{min} = \sum_{i=25}^{1024} \binom{1024}{i} P(1)^i (1-P(1))^{1024-i} \approx 1e-16$$

=>Let $L_2$=56 to fulfill $(2^{L_2}-1)P_{min}>>1$, $L_2$ being the number of bits for the random numbers to be assigned by the bit assignment unit 304 to the threshold comparator block 502.

8. This results in the following number of random bits:

| Unit | No of bits |
| --- | --- |
| First comparator unit 306 | 1024*15 |
| Second comparator unit 308 | 24*48 |
| Random selection unit 312 | 24*10 + 56 |
| Sign insertion unit 314 (Random sign signal) | 1024 |
| Total | 17832 |

This amounts to around 558 MT words which is around 90% of one MT.

Below is a comparison of the complexity of an implementation using identical comparator units for all samples across the distribution, with 1024 thresholds comparators with 80 thresholds each 56 bits in length.

| | Identical comparator units | Proposed method |
| --- | --- | --- |
| Number of 15 bits threshold comparison | 0 | 1024 × 15 |
| Number of 48 bits threshold comparison | 0 | 24 × 49 |
| Number of 56 bits threshold comparison | 1024 × 80 | 24 |
| Number of random bits | 57.3K (~2.87 Mersenne Twister) | ~17.8K (~0.9 Mersenne Twister) |
| MUX | n/a | 1024 × (25-to-1) MUX |
| Extra logic | n/a | Random positioning |

This is a factor of 3 improvement in the number of random bits using 56-bit threshold comparison for all 1024 samples, and a factor of 15 improvement in threshold comparison. While the addition of 1024 MUXs (25-to-1) and the random positioning block (negligible compared to the MUXs) adds extra fabrication cost, this is offset by the reduction in the number and size of threshold comparisons.

To this point, a proposed RNG to generate noise samples with a symmetric (e.g. Gaussian) PDF has been described.

Figure 8:
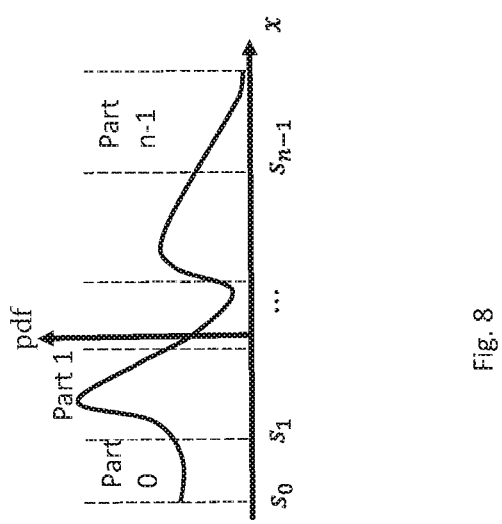
FIG. 8. shows an example of a non-symmetric distribution of noise.

Presented now is an RNG to generate a non-symmetric distribution that may be divided into n parts, n being an integer. An example of such a non-symmetric distribution is shown in FIG. 8. In the non-symmetric distribution shown in FIG. 8, the distribution has been divided into n parts, as shown by the dashed vertical lines. Some parts have higher probability than other parts.

Figure 9:
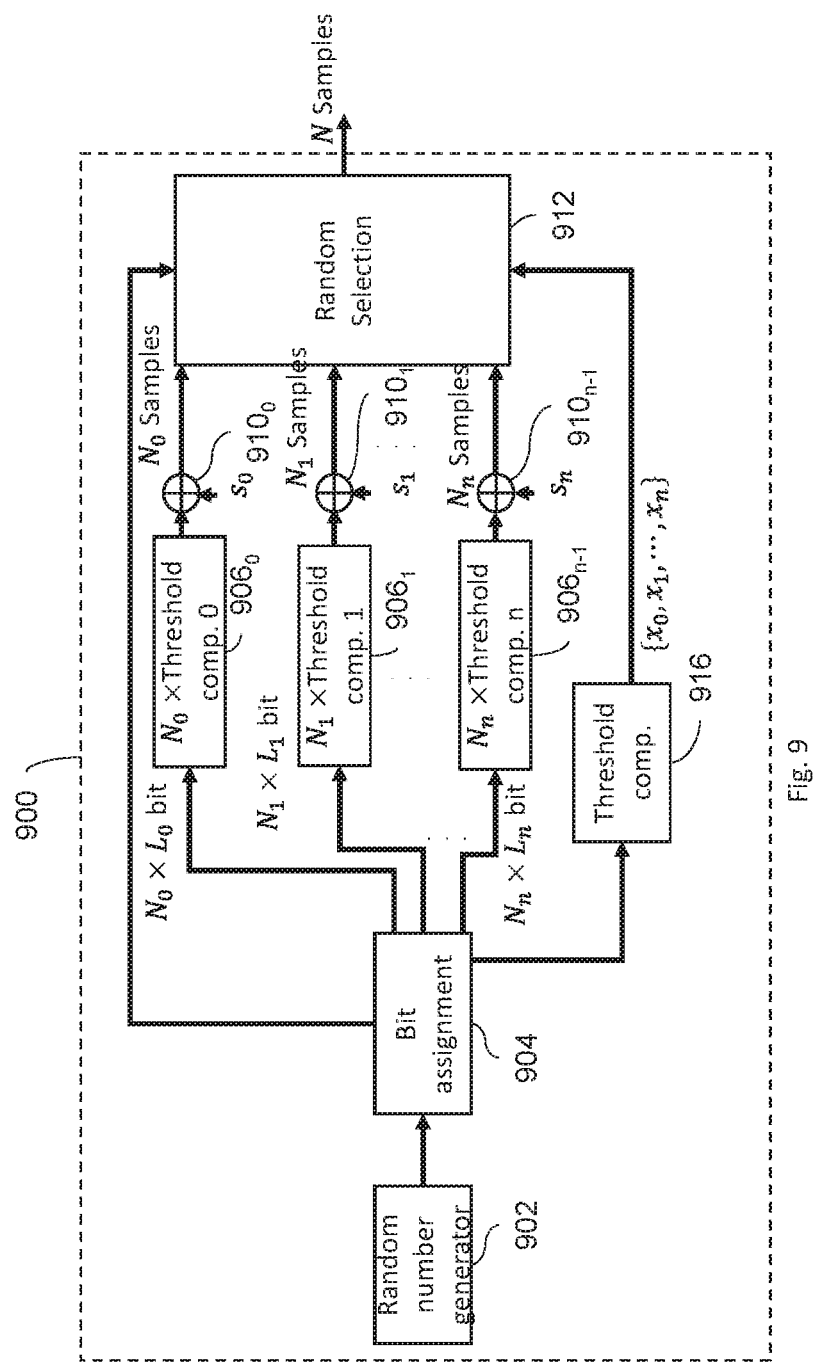
FIG. 9 is a block diagram of a system for implementing the methods described herein, according to another example embodiment.

FIG. 9 shows an implementation of a proposed RNG 900 to generate noise samples having such anon-symmetric distribution which may be divided into n parts, n being an integer greater than 2 (the two-part implementation having been discussed above). The RNG 900 comprises a random number generator 902, a bit assignment unit 904, a plurality of comparator units $906_0$, $906_1$, ..., $906_{n-1}$, a plurality of shift units $910_0$, $910_1$, ..., $910_{n-1}$ and a random selection unit 912. The number of comparator units $906_0$, $906_1$, ..., $906_{n-1}$ relates to the number of parts n into which the desired noise sample distribution is divided. For example, for a desired non-symmetric distribution as shown in FIG. 8, with the distribution divided into 5 parts, the RNG 900 would comprise five comparator units $906_0$, $906_1$, $906_2$, $906_3$, $906_4$.

Figure 10:
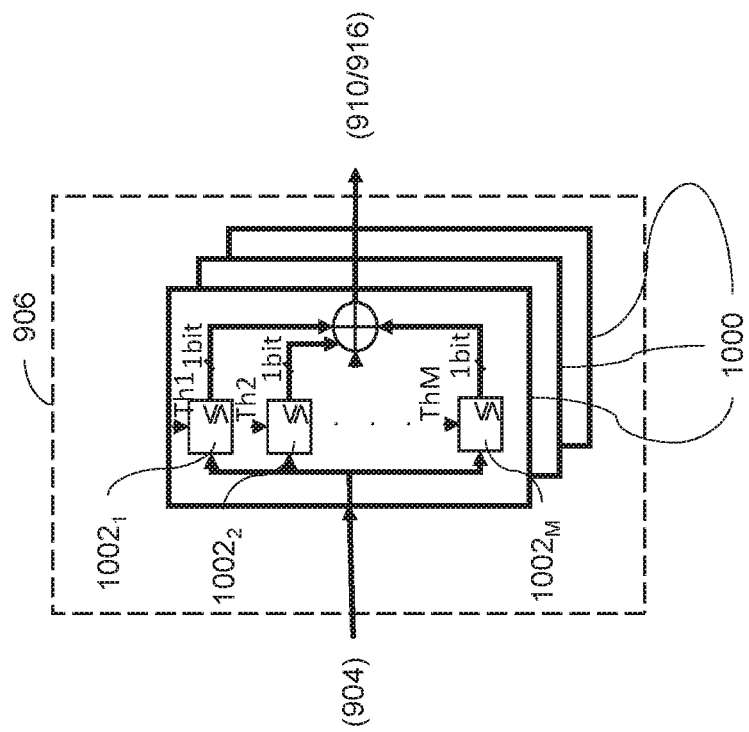
FIG. 10 is a block diagram of an embodiment of a comparator unit forming a part of the system shown in FIG. 9.

As shown in FIG. 10, each of the comparator units $906_0$, $906_1$, $906_2$, ..., $906_n$ comprises a plurality of threshold comparator units 1000. Each threshold comparator unit 1000 has a plurality M of threshold comparators $1002_1$, $1002_2$, ..., $1002_M$, where M is a positive integer. Each comparator unit $906_i$, has a plurality $N_i$ of threshold comparator units 1000, each having $M_i$ threshold comparators $1002_1$, $1002_2$, ..., $1002_{Mi}$, where $M_i$ is a positive integer. The first comparator unit $906_0$ has a first plurality ($N_0$) of threshold comparators units 1000, each having $M_0$ threshold comparators $1002_1$, $1002_2$, ..., $1002_{M0}$, where $M_0$ is a positive integer, second comparator unit $906_1$ has a second plurality ($N_1$) of threshold comparators units 1000, each of which having $M_1$ threshold comparators $1002_1$, $1002_2$, ..., $1002_{M1}$, where $M_1$ is a positive integer, and so on.

Each of the M threshold comparators $1002_1$, $1002_2$, ..., $1002_M$ has a threshold $Th_1$, $Th_2$ ..., $Th_M$. Each of the threshold comparator units 1000 of the comparator units $906_0$, $906_1$, $906_2$, ..., $906_{n-1}$ receive a random number from the bit assignment unit 904.

Each of the M threshold comparators $1002_1$, $1002_2$, ..., $1002_M$ compares the random number received from the bit assignment unit 904 with its threshold $Th_1$, $Th_2$ ..., $Th_M$ and outputs a bit on the basis of the comparison. For instance a threshold comparator $1002_1$, $1002_2$, ..., $1002_M$ outputs 1 when the received random number is equal to or higher/greater than the threshold and a 0 when the received random number is lower/less than the threshold. This threshold relationship may be defined differently, for instance outputting 1 when the received random number is higher/greater than the threshold and a 0 when the received random number is lower/less than or equal to the threshold or outputting a 1 rather than a 0. The M output bits of the threshold comparators $1002_1$, $1002_2$, ..., $1002_M$ are summed up to generate an output sample with [1d(M+1)] bits resolution. The number M of comparators in each threshold comparator unit 1000 determines the number of bits output of each sample output from each of the comparator units $906_0$, $906_1$, $906_2$, ..., $906_{n-i}$.

Referring to FIG. 9, the first comparator unit $906_0$ generates $N_0$ noise samples relating to the first part of the distribution (Part 0). $N_0$ random numbers assigned by the bit assignment unit 904 are input to the first comparator unit $906_0$, each random number being of length $L_0$. The first comparator unit $906_0$ outputs, at each clock cycle, $N_0$ noise samples of $M_0$ bits.

The second comparator unit $906_1$ generates $N_1$ noise samples relating to the second part of the distribution (Part 1). $N_1$ random numbers assigned by the bit assignment unit 904 are input to the second comparator unit $906_1$, each random number being of length $L_1$. The second comparator unit $906_1$ outputs, at each clock cycle, $N_1$ noise samples of $M_i$ bits.

The n-1$^{th}$ comparator unit $906_{n-1}$ generates $N_n$ noise samples relating to the n-1$^{th}$ part of the distribution (Part i). $N_i$ random numbers assigned by the bit assignment unit 904 are input to the i$^{th}$ comparator unit $906_i$, each random number being of length $L_i$. The i$^{th}$ comparator unit $906_i$ outputs, at each clock cycle, $N_1$ noise samples of $M_i$ bits.

In general, for each comparator unit $906_i$, the number $N_i$ of threshold comparator units 1000, the number $M_i$ of thresholds, the bit precision (i.e. the number of bits defined for provision by the bit assignment unit 904 to a particular comparator unit $906_i$) and the number of generated samples for different parts of the distribution is selected in dependence on the probability of each part.

The implementation of a proposed RNG 900 to generate noise samples having such a non-symmetric distribution which may be divided into n parts, n being an integer greater than 2 (the two-part implementation having been described above), is similar to the case of two parts, but with the calculations generalized:

$N_i$: For each part i (where i is an integer from 0 to n−1), a probability is calculated as shown in FIG. 7 but in terms of $\{n_0, n_1, \ldots\}$. Then $N_i$ is chosen for the probability with the plane $P=10^{-15}$ (as discussed in relation to FIG. 7).

$M_i$ only depends on how the PDF is split into parts (FIG. 8). There may be many ways to do this (as described above, for instance, the distribution may be split at $3\sigma$ or $3.5\sigma$ etc).

$L_i$: After choosing $M_i$, $L_i$ can be chosen with the same method described above in relation to the embodiment for two parts.

Thus, each comparator unit $906_i$ generates a plurality of samples $N_i$ for its associated part (Part i) of the distribution. A first plurality of samples $N_0$ is generated representing a first part (e.g. Part 0) of the distribution. A second plurality of samples $N_1$ is generated representing a second part (e.g. Part 1) of the distribution. For the distribution shown in FIG. 8, the probability of Part 1 is higher/greater than the probability of Part 0. The number of samples generated representing the lower-probability part of the distribution (part 0 in FIG. 8) is lower/less than the number of samples generated representing the higher-probability part of the distribution (Part 1). For the five parts shown in FIG. 8, Part 1 has the highest probability, then Part 3, then Part 0, then Part 4, then Part 2. The number of samples generated representing the highest-probability part of the distribution (Part 1 in FIG. 8) is higher/greater than the number of samples generated representing the next highest-probability part of the distribution (Part 3), which in turn is higher/greater than the number of samples generated representing the next highest-probability part of the distribution (Part 0), which in turn is higher/greater than the number of samples generated representing the next highest-probability part of the distribution (Part 4), which in turn is higher/greater than the number of samples generated representing the next highest-probability part of the distribution (Part 2).

As described above, for the five parts shown in FIG. 8, Part 1 has the highest probability, then Part 3, then Part 0, then Part 4, then Part 2. The bit precision ($L_i$) of the random number supplied by the bit assignment unit 904 to the comparator units $906_0$-$906_{n-1}$ increases as the probability associated with the part of the distribution decreases. For samples representing the highest-probability part of the distribution (Part 1 in FIG. 8) the bit precision ($L_i$) of random numbers assigned by the bit assignment unit 904 to the associated comparator unit $906_1$ is lower than the bit precision ($L_i$) of random numbers assigned by the bit assignment unit 904 to the associated comparator unit $906_3$ for samples generated representing the next highest-probability part of the distribution (Part 3), which in turn is lower than the bit precision ($L_i$) of random numbers assigned by the bit assignment unit 904 to the associated comparator unit $906_0$ for samples generated representing the next highest-probability part of the distribution (Part 0), which in turn is lower than the bit precision ($L_i$) of random numbers assigned by the bit assignment unit 904 to the associated comparator unit $906_4$ for samples generated representing the next highest-probability part of the distribution (Part 4), which in turn is lower than the bit precision ($L_i$) of random numbers assigned by the bit assignment unit 904 to the associated comparator unit $906_2$ for samples generated representing the lowest-probability part of the distribution (Part 2).

A random selection of samples from each plurality of samples are then output as the random noise samples.

Figure 11:
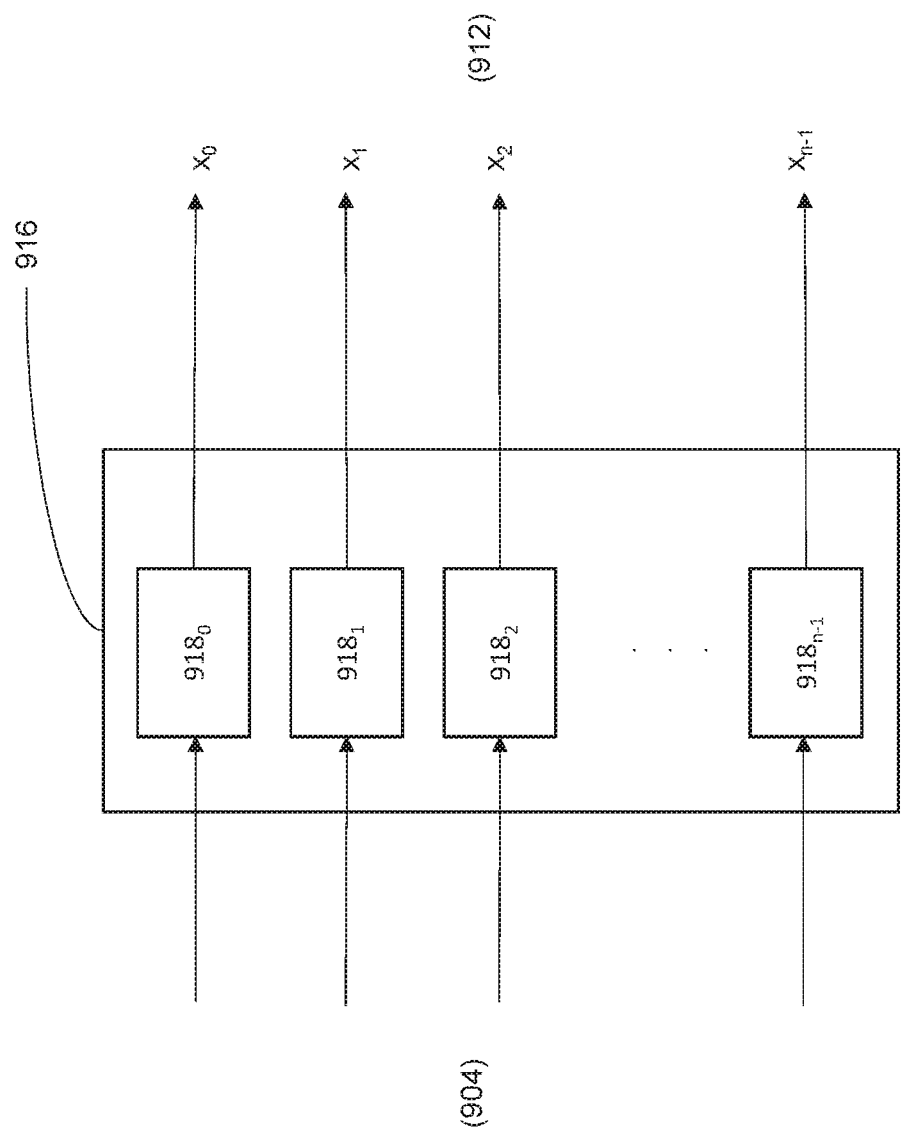
FIG. 11 is a block diagram of an embodiment of a threshold comparator block forming a part of the system shown in FIG. 9.

The random selection unit 912 selects samples from the comparator units $906_0, 906_1, 906_2, \ldots, 906_n$ each clock cycle. The random selection unit 912 may selects samples from each comparator unit $906_0, 906_1, 906_2, \ldots, 906_n$ in a manner similar to that described above in connection with FIG. 5. However, for determining which samples should be selected by the random selection unit, FIG. 5 shows an implementation for an RNG 900 to generate noise samples having a distribution which may be divided into n=2 parts, and therefore, a single (n−1) threshold comparator block (threshold comparator block 502) and a random positioning block 504 are used. For an RNG 900 to generate noise samples having a non-symmetric distribution which may be divided into n parts, n being an integer greater than 2, n−1 comparator blocks are needed, as shown in FIG. 11, to determine which samples should be selected by the random selection unit 912.

A threshold comparator block 916 shown in FIG. 9 determines how many samples $x_i$ should be selected by the random selection unit 912 from each comparator unit $906_i$ ($906_0, 906_1, 906_2, \ldots, 906_n$) on each clock cycle. Like the threshold comparator block 502 (in the two-part implementation), the threshold comparator block 916 comprises n−1 comparator blocks $918_1$-$918_{n-1}$, each of a design similar to that shown in FIG. 4, with each comparator blocks $918_1$-$918_{n-1}$ within the threshold comparator block 916 having $N_y$ threshold comparators $402_1, 402_2, \ldots, 402_{Ny}$, where $y \in \{0, 1, \ldots, n-1\}$. Note that to determine $x_i$ the values $x_0, \ldots, x_{i-1}$ are known. This means that the thresholds in ith comparator block depend on $x_0, \ldots, x_{i-1}$. Finally, $x_n$ is calculated as $x_n = N - (x_0 + x_1 + \ldots + x_{n-1})$. As a special case, one can set n=1 and derive the structure for the two parts case.

Each comparator block $918_i$ receives random bits from the bit assignment unit 904 and generates an output $x_i$ indicating, for that clock cycle, how many samples are to be selected by the random selection unit 912 from the respective comparator unit $906_0, 906_1, 906_2, \ldots, 906_n$. Each comparator block $918_i$ receives a random number from the bit assignment unit 904. This random number is then compared with the thresholds of the comparator block $918_i$ and outputs a number $x_i$ indicating the number of samples to be used from the respective comparator unit $906_i$ (the comparator unit outputting samples representative of the $i^{th}$ part of the distribution).

The random selection unit 912 then selects $x_i$ samples from the respective comparator unit $906_0, 906_1, 906_2, \ldots, 906_n$ that clock cycle.

When considering FIG. 9:
N is the total number of output samples at each clock cycle
$N_i$ is the number of samples generated in the $i^{th}$ comparator unit $906_i$ (for the $i^{th}$ part of the distribution)
$L_i$ is the bit precision (number of bits) of the thresholds at the $i^{th}$ comparator unit $906_i$.
$s_i$ is the shift for the $i^{th}$ comparator unit $906_i$.
$P(0), P(1), \ldots, P(n)$ are the probabilities of then parts $(P(0)+P(1)+ \ldots +P(n)=1)$
Assume that $\{x_0, x_1, \ldots, x_n\}$ are the number of samples from each of the n parts $(x_0 + x_1 + \ldots + x_n = N)(x_i$ can be at most equal to $N_i$).

The comparator units $906_0, 906_1, 906_2, \ldots, 906_{n-1}$ generate the number of samples from all the parts, i.e. $\{x_0, x_1, \ldots, x_n\}$ at each clock, based on the joint probability distribution $P(x_0, x_1, \ldots, x_n)$. These samples are shifted appropriately by the respective shift units $910_0, 910_1, \ldots,$ $910_{n-1}$ at the output of each comparator unit $906_0$, $906_1, \ldots, 906_{n-1}$ The random selection unit 912 then distributes the samples randomly and outputs N output noise samples at each clock cycle.

Figure 12:
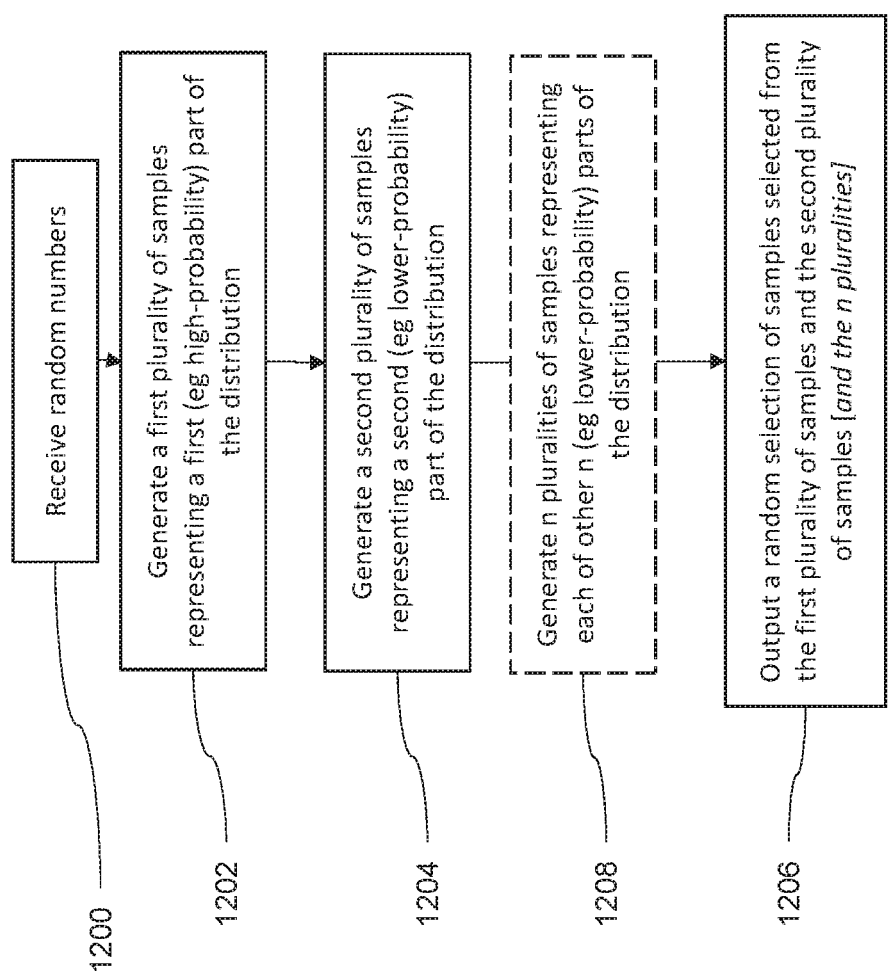
FIG. 12 is a flowchart illustrating steps of a method according to an example embodiment.

FIG. 12 is a flowchart illustrating steps of a random noise generation method described herein, for each clock cycle. Uniformly distributed random numbers are received (operation 1200). A first plurality of samples is generated representing a first (e.g. high-probability) part of the distribution (operation 1202). A second plurality of samples is generated representing a second (e.g. lower-probability) part of the distribution (operation 1204). The number of samples generated representing the second (e.g. lower-probability) part of the distribution (operation 1204) is lower/less than the number of samples generated representing the first (higher-probability) part of the distribution (operation 1202). A random selection of samples from the first plurality of samples and the second plurality of samples are then output (operation 1206).

For ease of explanation, the steps of FIG. 12 have been indicated as being performed sequentially. However, as the skilled person would understand, these steps may be performed continuously, in parallel and/or in real-time. As one example, operations 1202 and 1204 are performed in parallel. In addition, FIG. 12 is a flowchart illustrating steps of a random noise generation method described herein in which noise samples are generated for a probability distribution considered as two parts. However, as described above, the method is also applicable to a random noise generation method described herein in which noise samples are generated for a probability distribution considered as more than two parts. This is indicated by operation 1208 which refers to generating further pluralities of samples representing further (e.g. lower-probability) parts of the distribution.

FIG. 13 shows an example of a RNG as described herein implemented in a circuit (e.g., a ASIC) for testing and debugging the ASIC, for instance during manufacture or wafer level testing. The RNG 300/900 is shown in an ASIC 1300 that includes a receive (RX) circuit and a transmit (TX) circuit. The RX circuit comprises an Analog to Digital Converter (ADC) 1302, a MUX 1304, a RX Modem 1306 and a RX Forward Error Correction (FEC) unit 1308. The TX circuit comprises a MUX 1310, a TX FEC unit 1312, a TX Modem 1314 and Digital to Analog Converter (DAC) 1316. A Pseudo-Random Binary Sequence (PRBS) unit 1318 is also shown.

In test mode, the output of the PRBS unit 1318 is multiplexed by MUX 1310 to the TX path, FEC encoded by TX FEC unit 1312, and prepared for transmission by TX Modem 1314. In test mode, the modulated data is not sent to the DAC output 1316 but looped back to the RX path via MUX 1304.

Noise generated in the RNG 300/900 is added onto the test signal in the loop back path by a sum unit 1320. In test mode, the noise test data is multiplexed onto the RX path by MUX 1304, demodulated in RX Modem 1306 and FEC decoded by RX FEC unit 1308.

The decoded sequence is compared against the known PRBS sequence generated by PRBS unit 1318. Differences from the known sequence are treated as bit errors. The measured bit error ratio may serve as a performance measure for characterization of the FEC and modem components both in TX and RX direction.

This allows characterization of the digital ASIC components, in particular, when the ADC 1302 and the DAC 1316 are not yet running, or if the corresponding analogue outputs are not yet accessible, e.g., during waver level test.

This provides a test circuit to provide a test input to a logic device, wherein the logic device functions in response to the test input provided to the logic device while under test. The test circuit includes: a test signal generator (this may be considered to be TX Modem 1314, which outputs a signal) to produce a test signal, a RNG 300/900; and a sum unit 1320 connected to the output of the test signal generator and to the RNG 300/900 to add the test signal and the noise signal and output a test input to the logic device.

According to embodiments presented herein, a method is provided of designing a RNG for generating a plurality of random noise samples per clock cycle, the noise samples having an arbitrary distribution. In one example, the method comprises dividing the distribution of the noise samples into at least a first, high-probability part of the distribution and a second, low-probability part of the distribution. The distribution of the noise samples may be divided onto a plurality of parts comprising parts of differing probability. Based on a required number of samples per clock cycles, the number of samples per clock cycle required from the first, high-probability part of the distribution and the second, low-probability part of the distribution are determined, the number of samples per clock cycle required from the first, high-probability part of the distribution being higher than the number of samples from the second, low-probability part of the distribution. A first plurality of samples representing the high-probability part of the distribution according to the number of samples per clock cycle required from the first, high-probability part of the distribution is then generated and a second plurality of samples representing the low-probability part of the distribution according to the number of samples per clock cycle required from the second, low-probability part of the distribution is generated. A random selection of samples from the first plurality of samples and the second plurality of samples is output.

According to embodiments presented herein, a random noise generation method and RNG are provided that can be used for any probability distribution with at least a high probability part and a low probability part (e.g. a tail). For the application of a specific probability distribution (or a class of distributions e.g. with exponential tail), many bit positions in some thresholds are always fixed (either always 0 or always 1) as many of the thresholds refer to probabilities very close to 1. This means that in a fixed-point regime, they have a lot of fixed is in their bit pattern. With such a tail constraint, these positions may be fixed, and this reduces the number of comparisons.

Results show that, to generate noise samples with a Gaussian distribution, a significant portion of comparison complexity can be saved.

The RNG presented according to the embodiments herein uses fewer random bits compared with prior art approaches. Threshold comparator units of the proposed RNG can be optimized when the distribution/PDF (or class of PDFs, e.g. PDFs with exponential tail) is known by determining which bit positions in the thresholds are always fixed (either 0 or 1).

The presented RNG provides noise samples with much less complexity compared with the existing methods and is appropriate for high speed communications with parallel processing.

The presented RNG generates noise samples in the digital domain from a desired probability distribution function with long tails.

The RNG can be used for testing and debugging high speed communications ASIC functionality without involving any analog circuitry. This may, for instance, involve generating noise for loopback to stress test a chip during manufacture or wafer level testing, or the characterisation of FEC codes and hardware in bring-up considering the importance of measuring events with low occurrence rates. The RNG can be used for the addition of synthetic digital noise for optical characterisation (digital noise is much more controllable), or for adding random noise in loop-back for characterising the overall Soft-Decision FEC (SD-FEC) and Hard-Decision FEC (HD-FEC).

It should be understood that, in the present disclosure, the verb 'to operate' may be used to mean 'to execute' or 'to run'.

Those skilled in the art will recognise that a wide variety of modifications, alterations, and combinations can be made with respect to the above described examples without departing from the scope of the disclosed concepts, and that such modifications, alterations, and combinations are to be viewed as being within the ambit of the disclosed concepts.

Those skilled in the art will also recognise that the scope of the invention is not limited by the examples described herein, but is instead defined by the appended claims.

The approaches described herein may be embodied on a computer-readable medium, which may be a non-transitory computer-readable medium. The computer-readable medium carries computer-readable instructions arranged for execution upon a processor so as to make the processor carry out any or all of the methods described herein.

The term "computer-readable medium" as used herein refers to any medium that stores data and/or instructions for causing a processor to operate in a specific manner. Such storage medium may comprise non-volatile media and/or volatile media. Non-volatile media may include, for example, optical or magnetic disks. Volatile media may include dynamic memory. Exemplary forms of storage medium include, a floppy disk, a flexible disk, a hard disk, a solid state drive, a magnetic tape, or any other magnetic data storage medium, a Compact Disc Read-Only Memory (CD-ROM), any other optical data storage medium, any physical medium with one or more patterns of holes, a Random Access Memory (RAM), a Programmable ROM (PROM), an Erasable PROM (EPROM), a FLASH-EPROM, Non-Volatile RAM (NVRAM), and any other memory chip or cartridge.

A unit may be provided to define the ratio of samples taken from each part of the distribution.

A random positioning unit (random positioner) may be provided to randomly position the selected samples from the at least first and the second comparator units. A multiplexing unit may be provided that multiplexes the samples selected from the at least first and second comparator units according to the random positioning unit. The random selection unit may further comprise a round robin buffer configured to buffer samples from the second comparator unit and a threshold in the first comparator unit to control a multiplexer (MUX) stage.

The number of samples generated in the second plurality of samples may be fewer than the number of samples generated in the first plurality of samples. The first comparator unit may be configured to generate the first plurality of samples from random numbers of a first bit length, and the second comparator unit may be configured to generate the second plurality of samples from random numbers of a second bit length, the second bit length being greater than the first bit length. A random number generator may be provided and a random number assignment unit may allocate random numbers of the first bit length to the first comparator unit and to allocate random numbers of the second bit length to the second comparator unit.

A sign allocation unit (sign inserter) may be configured to assign a sign bit to each sample output from the random selection unit according to a random number.

Each of the at least first and second comparator units may comprise a plurality of threshold comparator units (threshold comparators), and the first comparator unit may have a lower/fewer number of threshold comparator units than the number of threshold comparator units in the second comparator unit. Each of the threshold comparator units may have a plurality of threshold comparators and each of the threshold comparator units in the first comparator unit may have a lower/fewer number of threshold comparators than the number of threshold comparators in each of the threshold comparator units in the second comparator unit.

The RNG may generate noise samples according to a symmetric distribution, for instance a Gaussian distribution. The distribution may be a PDF.

A test circuit may also be provided to provide a test input to a logic device (e.g., an Application Specific Integrated Circuit (ASIC)), wherein the logic device functions in response to the test input provided to the logic device while under test, the test circuit comprising a test signal generator to produce a test signal and a RNG, a sum unit (or summer) being connected to the test signal generator and to the RNG to add the test signal and the noise signal and output a test input to the logic device.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. One or more non-transitory computer readable storage media encoded with instructions to generate a plurality of random noise samples per clock cycle, the random noise samples having a distribution, and wherein the one or more non-transitory computer readable storage media are further encoded with instructions to:
   generate a first plurality of the random noise samples representing a high-probability part of the distribution;
   generate a second plurality of the random noise samples representing a low-probability part of the distribution; and
   output a random selection of the random noise samples from the first plurality of the random noise samples and the second plurality of the random noise samples.

2. The one or more non-transitory computer readable storage media of claim 1, further encoded with instructions to:
   randomly position the random noise samples in the random selection of the random noise samples; and
   multiplex the random noise samples in the random selection of the random noise samples.

3. The one or more non-transitory computer readable storage media of claim 1, further encoded with instructions to:

output a flag to indicate whether a given random noise sample is to be selected from the first plurality of the random noise samples or the second plurality of the random noise samples.

4. The one or more non-transitory computer readable storage media of claim 1, wherein the second plurality of the random noise samples comprises fewer random noise samples than the first plurality of the random noise samples.

5. The one or more non-transitory computer readable storage media of claim 1, further encoded with instructions to:
generate the first plurality of the random noise samples from random numbers of a first bit length, and
generate the second plurality of the random noise samples from random numbers of a second bit length, the second bit length being greater than the first bit length.

6. The one or more non-transitory computer readable storage media of claim 1, further encoded with instructions to:
assign a sign bit to each random noise sample of the random selection of the random noise samples according to a random number.

7. The one or more non-transitory computer readable storage media of claim 1, wherein the distribution is a symmetric distribution.

8. The one or more non-transitory computer readable storage media of claim 7, wherein the symmetric distribution is a Gaussian distribution.

9. The one or more non-transitory computer readable storage media of claim 1, wherein the distribution is a probability density function.

10. A system comprising:
the one or more non-transitory computer readable storage media of claim 1, configured to output a noise signal; and
a test circuit configured to provide a test input to a logic device, wherein the logic device functions in response to the test input while under test, the test circuit operable to:
produce a test signal;
add the test signal and the noise signal; and
output the test input to the logic device.

11. The system of claim 10, wherein the logic device is an Application Specific Integrated Circuit.

12. A random noise generation method for generating a plurality of random noise samples per clock cycle, the plurality of the random noise samples having a distribution, the method comprising:
generating a first plurality of the random noise samples representing a high-probability part of the distribution;
generating a second plurality of the random noise samples representing a low-probability part of the distribution; and
outputting a random selection of the random noise samples from the first plurality of the random noise samples and the second plurality of the random noise samples.

13. The random noise generation method of claim 12, further comprising:
randomly positioning the random noise samples in the random selection of the random noise samples; and
multiplexing the random noise samples in the random selection of the random noise samples.

14. The random noise generation method of claim 12, further comprising:
outputting a flag to indicate whether a given random noise sample is to be selected from the first plurality of the random noise samples or the second plurality of the random noise samples.

15. The random noise generation method of claim 12, wherein the second plurality of the random noise samples comprises fewer random noise samples than the first plurality of the random noise samples.

16. A method of designing a random noise generator for generating a plurality of random noise samples per clock cycle, the random noise samples having a distribution, the method comprising:
dividing the distribution into at least a first, high-probability part of the distribution and a second, low-probability part of the distribution;
determining, based on a required number of the random noise samples per clock cycle, a first number of the random noise samples per clock cycle required from the first, high-probability part of the distribution and a second number of the random noise samples per clock cycle required from the second, low-probability part of the distribution, the first number of the random noise samples being greater than the second number of the random noise samples;
generating a first plurality of the random noise samples representing the first, high-probability part of the distribution according to the first number of the random noise samples;
generating a second plurality of the random noise samples representing the second, low-probability part of the distribution according to the second number of the random noise samples; and
outputting a random selection of the random noise samples from the first plurality of the random noise samples and the second plurality of the random noise samples.

17. The method of claim 16, further comprising:
randomly positioning the random noise samples in the random selection of the random noise samples; and
multiplexing the random noise samples in the random selection of the random noise samples.

18. The method of claim 16, further comprising:
outputting a flag to indicate whether a given random noise sample is to be selected from the first plurality of the random noise samples or the second plurality of the random noise samples.

19. The random noise generation method of claim 12, further comprising:
generating the first plurality of the random noise samples from random numbers of a first bit length, and
generating the second plurality of the random noise samples from random numbers of a second bit length, the second bit length being greater than the first bit length.

20. The random noise generation method of claim 12, further comprising:
assigning a sign bit to each random noise sample of the random selection of the random noise samples according to a random number.

* * * * *

UNITED STATES PATENT AND TRADEMARK OFFICE
CERTIFICATE OF CORRECTION

PATENT NO. : 11,550,547 B2
APPLICATION NO. : 16/732603
DATED : January 10, 2023
INVENTOR(S) : Mohammad Ali Sedaghat et al.

It is certified that error appears in the above-identified patent and that said Letters Patent is hereby corrected as shown below:

On the Title Page

(30) Foreign Application Priority Data:
Please replace "1900078" with --1900078.5--

Signed and Sealed this
Seventh Day of March, 2023

Katherine Kelly Vidal
Director of the United States Patent and Trademark Office